US010325781B2

(12) United States Patent
Shinoda et al.

(10) Patent No.: US 10,325,781 B2
(45) Date of Patent: Jun. 18, 2019

(54) ETCHING METHOD AND ETCHING APPARATUS

(71) Applicant: Hitachi High-Technologies Corporation, Tokyo (JP)

(72) Inventors: Kazunori Shinoda, Tokyo (JP); Satoshi Sakai, Tokyo (JP); Masaru Izawa, Tokyo (JP); Nobuya Miyoshi, Tokyo (JP); Hiroyuki Kobayashi, Tokyo (JP); Yutaka Kouzuma, Tokyo (JP); Kenji Ishikawa, Kanagawa (JP); Masaru Hori, Aichi (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 15/698,823

(22) Filed: Sep. 8, 2017

(65) Prior Publication Data

US 2018/0076051 A1    Mar. 15, 2018

(30) Foreign Application Priority Data

Sep. 9, 2016 (JP) ................. 2016-176198

(51) Int. Cl.
| | |
|---|---|
| *H01L 21/321* | (2006.01) |
| *H01L 21/3213* | (2006.01) |
| *H01L 21/311* | (2006.01) |
| *H01L 21/67* | (2006.01) |
| *H01L 27/11556* | (2017.01) |
| *H01L 27/11582* | (2017.01) |

(52) U.S. Cl.
CPC .. *H01L 21/32136* (2013.01); *H01L 21/31116* (2013.01); *H01L 21/67069* (2013.01); *H01L 21/67115* (2013.01); *H01L 27/11556* (2013.01); *H01L 27/11582* (2013.01)

(58) Field of Classification Search
CPC .................................. H01L 21/32136
USPC ........................................ 438/715
See application file for complete search history.

(56) References Cited

U.S. PATENT DOCUMENTS

| 2006/0016783 A1 | 1/2006 | Wu et al. |
| 2011/0061810 A1 | 3/2011 | Ganguly et al. |
| 2015/0232986 A1 | 8/2015 | Kameda et al. |
| 2016/0141299 A1 | 5/2016 | Hong |

FOREIGN PATENT DOCUMENTS

| JP | 2006-035213 A | 2/2006 |
| KR | 10-2013-0016269 A | 2/2013 |
| KR | 10-2015-0097413 A | 8/2015 |
| KR | 10-2016-0059930 A | 5/2016 |

OTHER PUBLICATIONS

Korean Office Action received in corresponding Korean Application No. 10-2017-0109136 dated Jul. 16, 2018.

*Primary Examiner* — Roberts P Culbert
(74) *Attorney, Agent, or Firm* — Mattingly & Malur, PC

(57) ABSTRACT

A method for etching a titanium nitride film includes a first process of supplying reactive species, which include hydrogen and fluorine, to a base material including a titanium nitride film on at least a part of a surface, and a second process of vacuum-heating the base material to remove the surface reaction layer that is generated on the surface of the titanium nitride film in the first process.

12 Claims, 12 Drawing Sheets

ETCHING METHOD AND ETCHING APPARATUS

BACKGROUND OF THE INVENTION

1. Field of the Invention

The present invention relates to an etching method and an etching apparatus of a titanium nitride film.

2. Description of the Related Art

Along with spreading of mobile equipment represented by a smartphone, high-integration of a semiconductor device is in progress. In a recording semiconductor field, mass production of a three-dimensional (3D) NAND flash memory, in which memory cells are multi-stage stacked in a three-dimensional direction, is initiated, and the number of memory layers is 48. In addition, in a logic semiconductor field, a fin-type field effect transistor (FET) having a three-dimensional structure becomes the main stream. A gate length of the FET is steadily reduced, and it is also expected that the gate length becomes shorter than 10 nm.

In this manner, along with progress in a three-dimensional element structure and miniaturization of processing dimensions, in a device manufacturing process, necessity for an etching technology, which is provided with high selectivity and isotropy with respect to an underlying film and high processing-dimension controllability in an atomic layer level, has been increased.

In the related art, as a high-selectivity and isotropic etching technology, wet etching technologies such as etching of silicon dioxide by using a mixed aqueous solution of a hydrofluoric acid and ammonium fluoride, etching of silicon nitride by using a thermal phosphoric acid, and etching of titanium nitride film by using a mixture of aqueous ammonia, hydrogen peroxide, and water, have been widely used. However, in the wet etching technologies using chemicals in the related art, there is a problem that pattern collapse, which is caused by surface tension of a rinse liquid, is actualized along with miniaturization of a pattern.

For example, in a case of using a high aspect ratio pattern of silicon, when a pattern interval is narrowed, it is reported that a pattern interval threshold value, at which collapse starts at the surface tension at the time of drying the rinse liquid, increases in proportional to the square of the aspect ratio. According to this, there is a strong demand for development of a process method of isotropically etching various films without using chemicals.

The titanium nitride is a material that is widely used as a gate electrode, a diffusive barrier metal, or a hard mask in a semiconductor device manufacturing process. According to this, in a next-generation semiconductor device manufacturing process, there is a demand for a titanium nitride etching technology provided with high selectivity and isotropy, and high processing dimension controllability in an atomic layer level.

In the related art, as an isotropic titanium nitride etching technology that does not use chemicals, JP-2006-35213-A discloses a method of isotropically etching titanium nitride. In the method, a substrate is set to a temperature of 50° C. to 900° C., radicals which contain fluorine or chlorine are supplied by using plasma, and the titanium nitride is isotropically etched at an etching rate of greater than 80 nm/minute.

SUMMARY OF THE INVENTION

In the future, for example, in a gate electrode processing of a next-generation 3D-NAND flash memory, it is considered that a technology of isotropically etching a titanium nitride film in controllability in an atomic layer level is required in a process of etching the titanium nitride film, which is embedded in a minute groove having a high aspect ratio, in a transverse direction to electrically separate the titanium nitride film. Here, as an example, the present inventors have made an investigation on a case where the plasma etching technology disclosed in JP-2006-35213-A is applied to a structure as illustrated in FIG. 9. The result is illustrated in FIG. 9. FIG. 9 is a schematic view illustrating a variation of a wafer cross-sectional structure in a case of using plasma etching in the related art. In FIG. 9, a drawing on a left side illustrates a state (S901) in which a groove having a high aspect ratio is formed in a multilayered film which is formed in a groove of a polycrystalline silicon film 330 and includes a titanium nitride film 321 and a silicon dioxide film 371, a drawing on a center side illustrates a state (S902) in which radicals (reactive species) 223 containing fluorine or chlorine are supplied to etch the titanium nitride film 321, and the titanium nitride film is removed as a reaction product 281, and a drawing on a right side illustrates a state (S903) in which etching of the titanium nitride film is stopped. Furthermore, the polycrystalline silicon film 330 is formed on the silicon dioxide film 371, and the silicon dioxide film 371 is formed on a surface of the polycrystalline silicon film.

As illustrated in the drawing on the center side of FIG. 9, in a groove having a high aspect ratio in which the titanium nitride film 321 and the silicon dioxide film 371 are alternately stacked, only the titanium nitride film 321 is etched in a transverse direction and etching is continuously progressed in a state in which a temperature is raised. Accordingly, a surface reaction layer is not formed on a surface of the titanium nitride film 321, and etching is continuously progressed due to continuous desorption of the reaction product 281. In this case, the reactive species 223 are consumed in the vicinity of a pattern opening, and the amount of the reactive species 223, which reach a deep region on a lower side of a pattern, decreases. According to this, a distribution of the etching amount becomes non-uniform in reflection of a distribution of the reactive species 223. The etching amount is great in the vicinity of the pattern opening, and is small in the deep portion of the pattern. As a result, in the continuous etching technology of the related art, a great distribution of the etching amount occurs in a depth direction of the pattern, and thus it is considered that an element yield ratio relating to dimension controllability of the etching amount decreases. That is, in the isotropic etching technology of the titanium nitride in the related art, for example, etching of the titanium nitride is continuously progressed at an etching rate of greater than 80 nm/minute, and the etching amount is controlled with plasma processing time. According to this, it is difficult to control the etching amount with high processing dimension controllability in an atomic layer level. In addition, the etching amount becomes non-uniform in reflection of the distribution of the radicals, uniformity of the etching amount is low in a wafer in-plane direction or a pattern depth direction. Accordingly, in the continuous plasma etching technology of the titanium nitride of the related art, it is considered that an applied process in device manufacturing in the next generation and thereafter is limited.

An object of the invention is to provide a titanium nitride film etching method and a titanium nitride etching apparatus which are capable of controlling an etching amount with high processing dimension controllability in an atomic layer level and are excellent in uniformity of an etching amount in a wafer in-plane direction or a pattern depth direction. The object and new features of the invention will become apparent from description of this specification and attached drawings.

To accomplish the above-described object, for example, configurations and procedures described in the attached claims are employed.

The present application includes a plurality of means to solve the above issue, and an example thereof is an etching method for etching a titanium nitride film, including: a first process of supplying reactive species, which include hydrogen and fluorine, to a base material that includes a titanium nitride film on at least a part of a surface; and a second process of vacuum-heating the base material to remove a surface reaction layer that is formed on a surface of the titanium nitride film in the first process.

In addition, there is provided an etching method including repeating, in a plurality of cycles, a combination of a first process of supplying reactive species which contain hydrogen, oxygen, and fluorine to a base material including a titanium nitride film at least at a part of a surface, and a second process of removing a surface reaction layer generated on a surface of the titanium nitride film in the first process by vacuum-heating the base material to etch the titanium nitride film, the combination being set as one cycle.

In addition, there is provided an apparatus that etches a titanium nitride film and includes: a processing chamber; a workpiece that is provided in the processing chamber, and includes the titanium nitride film on at least a part of a surface; a stage on which the workpiece is loaded; a plasma source that supplies radicals, which include hydrogen and fluorine, into the processing chamber; a vacuum pump that reduces a pressure of the processing chamber; and a heating unit that heats the workpiece so as to remove a surface reaction layer that is formed on a surface of the titanium nitride film with the radicals including hydrogen and fluorine.

An effect, which is obtained by a representative configuration of the invention disclosed in this specification, is as follows. According to the invention, it is possible to provide a technology of etching a titanium nitride film with high uniformity in a wafer in-plane direction or a pattern depth direction, and high processing-dimension controllability in an atomic layer level (isotropic and atomic layer level etching technology of the titanium nitride film).

DESCRIPTION OF THE PREFERRED EMBODIMENTS

Figure 1:
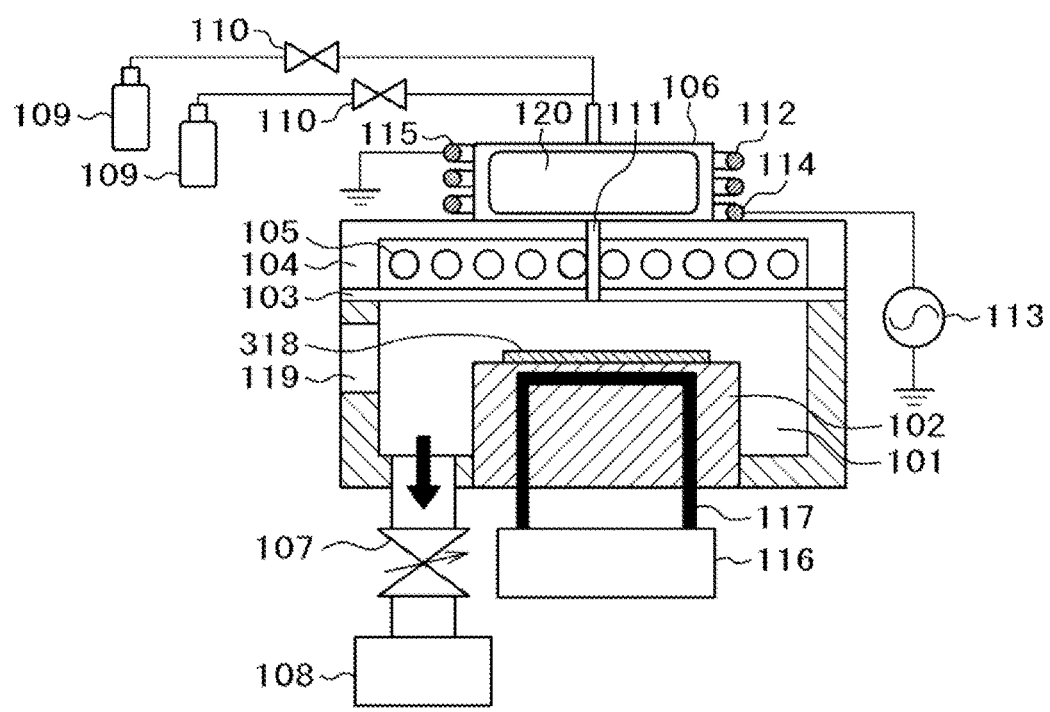
FIG. 1 is a schematic cross-sectional view of an etching apparatus according to a first embodiment of the invention.

The present inventors have attempted to etch a titanium nitride film by using various kinds of gases. As a result, they obtained the following findings. (1) When supplying reactive species which contain fluorine and hydrogen to a titanium nitride film, a non-volatile film (surface reaction layer) is formed on a surface of the titanium nitride film, (2) the amount of the surface reaction layer generated has a self-limiting property, and (3) the surface reaction layer is removed through heating. The present invention is made on the basis of the new findings. Specifically, the surface reaction layer is formed by supplying reactive species which contain fluorine and hydrogen to a surface of the titanium nitride film, and the surface reaction layer is removed through heating. In addition, the formation and the removal of the surface reaction layer are repeated to etch the titanium nitride film by only a desired amount.

According to the etching technology of the present invention, processing having a self-limiting property is performed, and thus uniformity in an etching amount in a wafer in-plane direction and a pattern depth direction is enhanced. In addition, a film thickness of the titanium nitride, which is removed by one cycle, has a constant thickness in an atomic layer level, and a total etching amount is determined by the number of times of repeated cycle processing. Accordingly, it is possible to accurately control the etching amount with processing dimension accuracy in the atomic layer level. That is, atomic-layer-level etching of the titanium nitride film is realized.

Furthermore, here, an etching method, in which each process has a self-limiting property, and which includes cyclic repetition of a process of forming the surface reaction layer and a process of removing the surface reaction layer, is referred to as "atomic-layer-level etching". In the term, "atomic layer" is used. However, there is no limitation to narrow atomic layer etching in which an etching amount per cycle is one atomic layer, and the term is also used as long as each process has a self-limiting tendency with respect to processing time and the like even though the etching amount per cycle is in the order of nanometer. On the other hand, other terms such as "digital etching", "self-limited cycle etching", and "atomic layer etching" may be used in some cases when expressing the same meaning.

Hereinafter, the invention will be described in detail in embodiments with reference to the accompanying drawings. Furthermore, in all drawings referenced to describe the embodiments, the same reference numeral will be given to a constituent element having the same function, and redundant description thereof will not be repeated. In addition, in the drawings referenced to describe the embodiments, hatching may be given for easy understanding of a configuration even in a plan view.

Example 1

Description will be given of a first embodiment with reference to FIG. 1 to FIG. 7. This embodiment corresponds to an example in which reactive species, which are generated with plasma of $NF_3$ gas and $H_2$ gas, are used, and a titanium nitride film on a silicon wafer is isotropically etched in an atomic layer level.

FIG. 1 is a cross-sectional view illustrating an overview of a configuration of an etching apparatus according to this embodiment. This apparatus includes a wafer stage 102 that is provided inside a processing chamber 101, a lamp unit 104 that is provided on an upper side of the processing chamber 101 with quartz glass 103 interposed therebetween, an infrared lamp 105 that is provided in the lamp unit 104, and a plasma source 106 that is provided on an upper side of the lamp unit 104. The processing chamber 101, the quartz glass 103, and the lamp unit 104 are configured to have an air-tight structure with a vacuum sealing unit such as an O-ring, and the air-tight structure is evacuated by a vacuum pump 108 that is connected thereto through a variable conductance valve 107. In addition, in the apparatus, a gas supply unit including a gas cylinder 109 and a valve 110 is provided, and a gas, which is supplied from the gas cylinder 109, is introduced to the plasma source 106 through the valve 110. The introduced gas is activated with the plasma source 106 to generate radicals, and various reactive species including the radicals, which are generated, are supplied to the processing chamber 101 through a gas introduction pipe 111.

The plasma source 106 includes a coil-shaped antenna 112, an output of a radio frequency power supply 113 is connected to a feeding point 114, and the plasma source 106 is grounded by a ground point 115. In addition, the wafer stage 102 is cooled down by a circulator 116 and a cooling line 117. In addition, although not illustrated in the drawing, a mechanism that supplies a helium gas is provided between a rear surface of a wafer 318 and the wafer stage 102 to efficiently cool down the wafer 318.

As a material of the processing chamber 101, a material, which is excellent in plasma resistance and is less likely to cause heavy metal contamination or contamination due to foreign matters in the wafer, is preferable. For example, aluminum of which a surface is treated with anodized aluminum, and the like are preferable. Alternatively, a material, which is obtained by thermally spraying a material such as yttrium oxide, alumina, and silicon dioxide to an aluminum base material, is also possible. In addition, a pressure of the processing chamber 101 can be constantly maintained by the variable conductance valve 107 and the vacuum pump 108, which are connected to the processing chamber 101, in a state in which a desired flow rate of processing gas is allowed to flow. In addition, as a material of the wafer stage 102, aluminum of which a surface is treated with anodized aluminum, and the like are preferable.

The quartz glass 103, which is configured to maintain an air-tight state with the processing chamber 101 by a vacuum sealing unit such as an O-ring, is provided on an upper side of the processing chamber 101. As the quartz glass 103, it is preferable to use a raw material with high optical transmittance. For example, it is preferable to use fused quartz glass with ultra-high purity which is obtained by fusing a raw material with high purity in oxyhydrogen flame, and the like. In addition, the gas introduction pipe 111 as a rectification unit is connected to the quartz glass 103 to supply the reactive species, which are activated with the plasma source 106, to the processing chamber 101. Furthermore, a shape of the rectification unit is appropriately selected in accordance with the purpose of changing a radical supply mode to the processing chamber 101. For example, when using a disc-shaped shower plate or a donut-shaped introduction pipe, it is possible to introduce radicals to a vacuum chamber with uniformity. At this time, as a material of the rectification unit, a material that is excellent in plasma resistance and is less likely to be particles or contaminant, that is, fused quartz or an yttrium oxide sintered body is preferable.

On an upper side of the quartz glass 103, the lamp unit 104 including the infrared lamp 105 for wafer heating is provided. As the infrared lamp 105, a halogen lamp and the like can be used. Furthermore, an example in which the infrared lamp is used as a wafer heating unit is illustrated in this embodiment, but a separate heating unit such as a resistive heater may be used.

A frequency of the radio frequency power supply 113 connected to the plasma source 106 is appropriately selected in a range of 400 kHz to 40 MHz, and 13.56 MHz is used in this embodiment. In addition, the radio frequency power supply 113 has a frequency matching function (not illustrated in the drawing). That is, the radio frequency power supply 113 has a function that is capable of allowing an output frequency to vary from a center frequency of 13.56 MHz in a range of ±5% to ±10%, and is capable of performing a frequency feedback control so that a ratio between reflective wave power $P_r$ and progressive wave power $P_f$ which are monitored at an output portion of the radio frequency power supply 113, that is, $P_r/P_f$ decreases.

With regard to the kind of gases which are supplied to the plasma source 106, a combination of a gas that contains fluorine and a gas that contains hydrogen, a gas that contains both fluorine and hydrogen, or a mixed gas obtained by diluting the gases with other gases are used so as to supply reactive species which contain fluorine and hydrogen to the wafer.

Examples of the gas that contains fluorine include HF, $NF_3$, $CF_4$, $CHF_3$, $CH_2F_2$, $CH_3F$, $C_2F_6$, $C_4F_8$, $SF_6$, and the like. In addition, examples of the gas that contains hydrogen include HF, $H_2$, $H_2O$, $NH_3$, $CH_4$, $CHF_3$, $CH_2F_2$, $CH_3F$, and the like. In addition, examples of the gas that contains both fluorine and hydrogen include HF, $CHF_3$, $CH_2F_2$, $CH_3F$, and the like. In addition, the above-described gases may be appropriately diluted by adding other gases such as Ar, He, $N_2$, and $O_2$ thereto.

Examples of a specific combination include $NF_3/NH_3$, $CH_2F_2/H_2$, $CF_4/H_2/Ar$, $CHF_3/O_2$, $CH_2F_2/O_2$, $CH_2F_2/N_2$, NF$_3$/NH$_3$/O$_2$, and the like. In this embodiment, NF$_3$/H$_2$ is used, but other combinations may be used.

Figure 2:
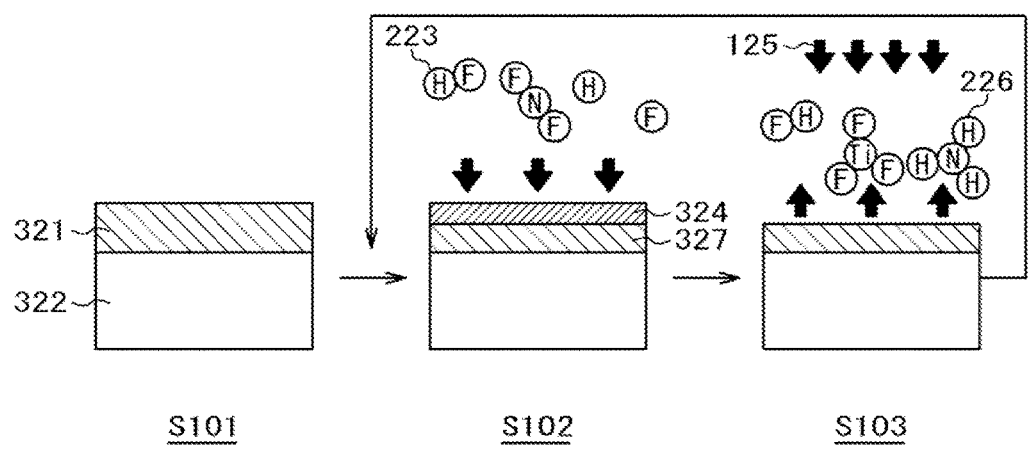
FIG. 2 is a schematic element cross-sectional view illustrating an example of a procedure in the etching method according to the first embodiment of the invention.

A schematic view of FIG. 2 illustrates a procedure in the etching method of the titanium nitride film according to this embodiment, and illustrates a variation of a wafer cross-sectional structure in respective processes of the etching. In this embodiment, first, a titanium nitride film 321 is formed on a silicon layer (silicon base body) 322 (step S101). Next, reactive species 223 which contain radicals of hydrogen and fluorine are supplied to the titanium nitride film 321, and chemically react with a surface of the titanium nitride film 321 to form a surface reaction layer 324 that contains ammonium fluorotitanate as a main component (step S102, first process). Next, the surface reaction layer is heated to a temperature of 100° C. or higher with means such as irradiation with infrared light 125 to thermally decompose the surface reaction layer 324 and to volatilize a decomposition product 226, thereby removing the decomposition product 226 from a surface of the titanium nitride film 321 (step S103, second process). A combination of the first process of forming the surface reaction layer 324 and the second process of removing the surface reaction layer 324 are set as one cycle, and etching is performed by repeating the cycle by the number of times in which a total etching amount reaches a target value.

Furthermore, in this embodiment, a gas system that does not contain chlorine is used. The reason for this is as follows. When using a gas that contains chlorine, highly volatile titanium chloride is generated as a reaction product, and etching continuously progresses without remaining of the reaction product on the surface, and thus it is difficult to perform cycle etching with high controllability.

Figure 3:
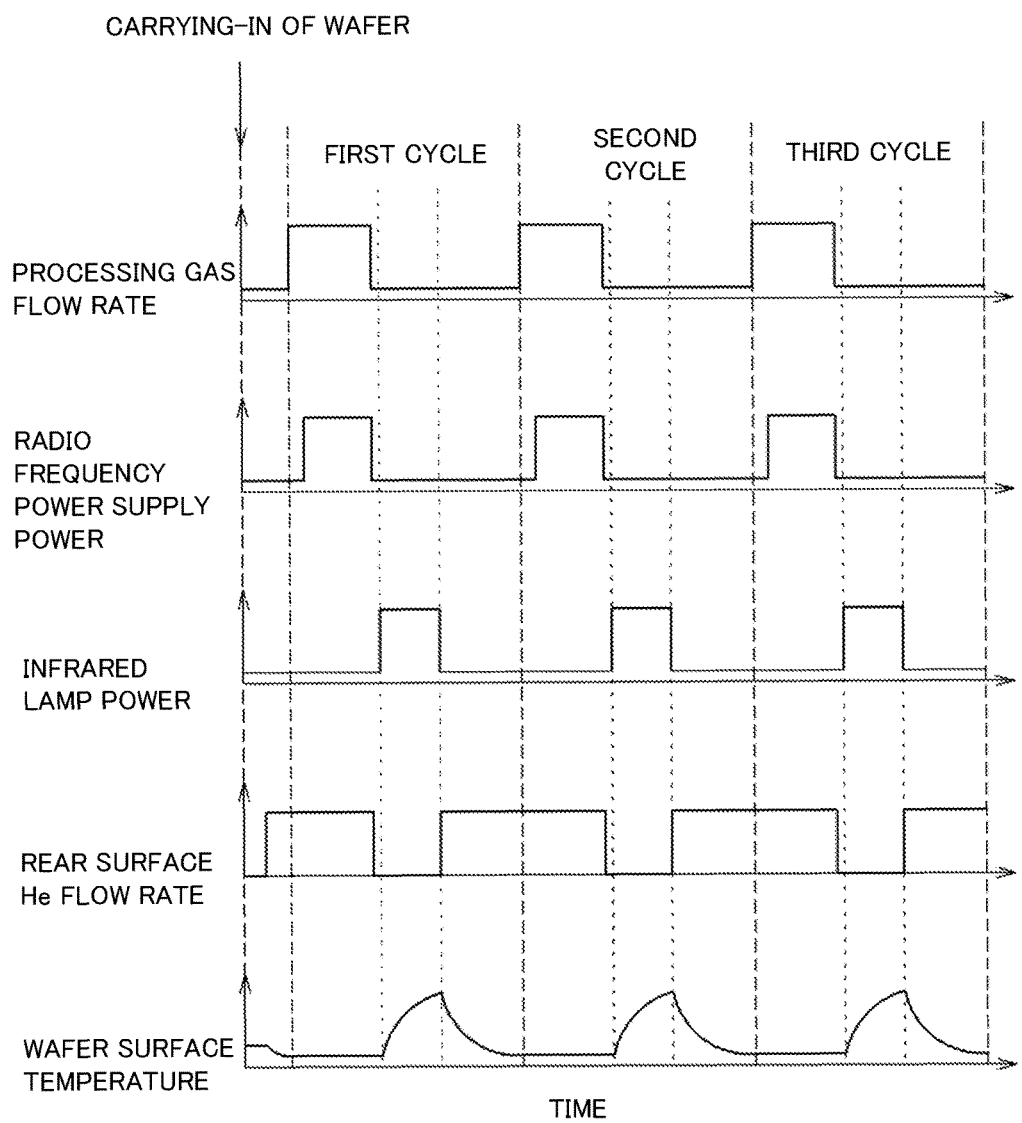
FIG. 3 is a schematic view illustrating an example of a temporal variation of parameters in the etching apparatus according to the first embodiment of the invention, and a processing gas flow rate, a radio frequency power supply power, infrared lamp power, a rear surface He flow rate, and a wafer surface temperature in this order from an upper end.

A schematic view of FIG. 3 illustrates a procedure in the etching method of the titanium nitride film according to this embodiment, and illustrates a variation of apparatus parameters in respective processes of the etching. Here, a temporal variation of a processing gas flow rate, radio frequency power supply power, infrared lamp power, a rear surface He flow rate, and a wafer surface temperature in the cycle etching are illustrated. Hereinafter, the cycle etching of the titanium nitride film related to this embodiment will be described in detail with reference to FIG. 1 to FIG. 3.

First, the wafer 318, on which the titanium nitride film to be etched is formed, is carried in from a wafer carrying-in port 119 by a wafer transfer apparatus (not illustrated in the drawing), and is loaded on the wafer stage 102. At this time, a temperature of the wafer stage 102 is controlled to 10° C. by the circulator 116 and the cooling line 117, and thus a wafer temperature is cooled down to 10° C. Then, in a state in which the wafer carrying-in port 119 is closed and the processing chamber 101 is air-tightly maintained, the processing chamber 101 is evacuated by the vacuum pump 108 through the variable conductance valve 107.

On the other hand, in the plasma source 106, a NF$_3$ gas and a H$_2$ gas are supplied, and radio frequency power is supplied from the radio frequency power supply 113 to the coil-shaped antenna 112, and thus plasma 120 is formed. At this time, a flow rate of the NF$_3$ gas is set to 20 sccm, and a flow rate of the H$_2$ gas is set to 40 sccm. A raw material gas including NF$_3$ and H$_2$ is activated by the plasma 120, and turns into reactive species 223 including fluorine radicals, hydrogen radicals, hydrogen fluoride, and the like. The reactive species 223 flow into the processing chamber 101 from the gas introduction pipe 111. The reactive species 223, which flow into the processing chamber 101 and include hydrogen or fluorine, uniformly diffuse to the entirety of the processing chamber 101, and are adsorbed to the entire surface of the wafer 318 loaded on the wafer stage 102.

The reactive species 223, which are adsorbed to the wafer 318, react with the titanium nitride film 321 on the surface of the wafer 318 to form the surface reaction layer 324 in which hydrogen, nitrogen, fluorine, and titanium are mixed with each other. The surface reaction layer 324 is a reaction product in which a nitrogen-hydrogen bond or a titanium-fluorine bond is a main bond, and has characteristics in which a binding energy of nitrogen is spectrum has a peak in the vicinity of 402±2 eV in measurement with X-ray photoelectron spectroscopy using Kα-rays of aluminum.

Figure 4:
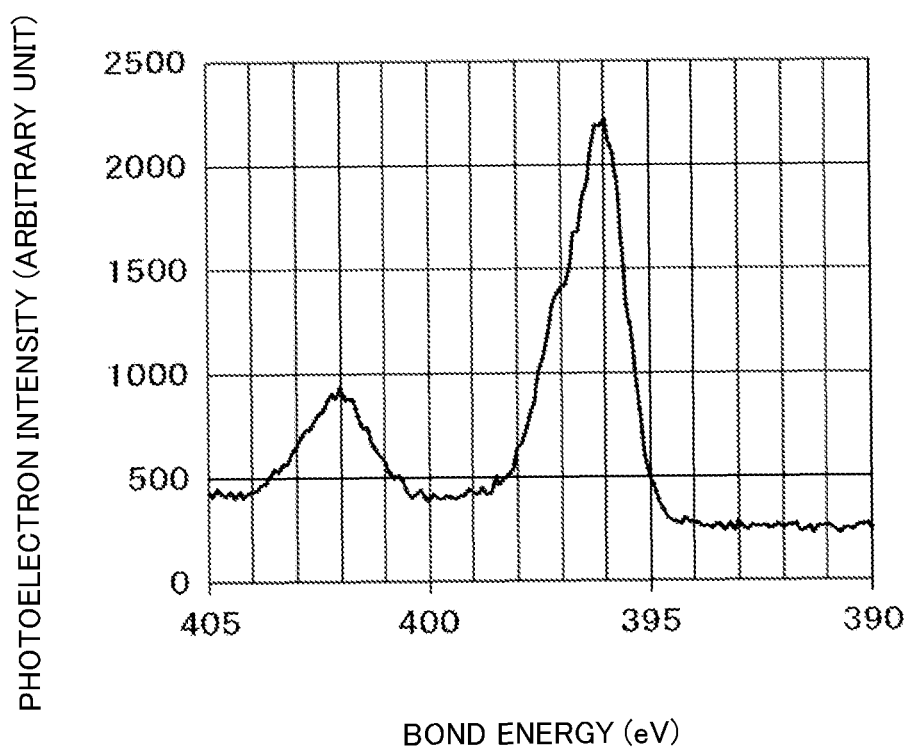
FIG. 4 is a view illustrating an example of an analysis result of a surface reaction layer that is formed when supplying reactive species (radicals) which contain fluorine and hydrogen to a titanium nitride film in the etching method according to the first embodiment of the invention.

FIG. 4 is a photoelectron spectrum of nitrogen is in a case of analyzing the titanium nitride film 321, on which the surface reaction layer 324 is formed, with the X-ray photoelectron spectroscopy using Kα-rays of aluminum. A peak, which indicates presence of the nitrogen-hydrogen bond and is caused by the surface reaction layer 324, is observed in the vicinity of binding energy of 402±2 eV in addition to a peak that is caused by unreacted titanium nitride film 327 as a base and is observed in the vicinity of binding energy of 396 eV. It is considered that a main component of the surface reaction layer 324 is an ammonium salt, for example, ammonium fluorotitanate.

Furthermore, it is considered that a typical composition of the surface reaction layer 324 is ammonium fluorotitanate. However, the following cases are also considered. Specifically, a case where various bonding states of hydrogen, nitrogen, fluorine, and titanium such as elementary hydrogen, elementary fluorine, NH$_3$, and TiF$_4$ are mixed in depending on the composition of the reactive species which are used or reaction time, or a case where slight oxygen caused by surface oxides and the like of the titanium nitride film is included may be present. On the other hand, a value of the binding energy stated here is a value that is corrected on the assumption that a position of carbon is peak, which is observed on a surface of an initial sample and is caused by surface contamination carbon, is 284.5 eV.

Figure 5:
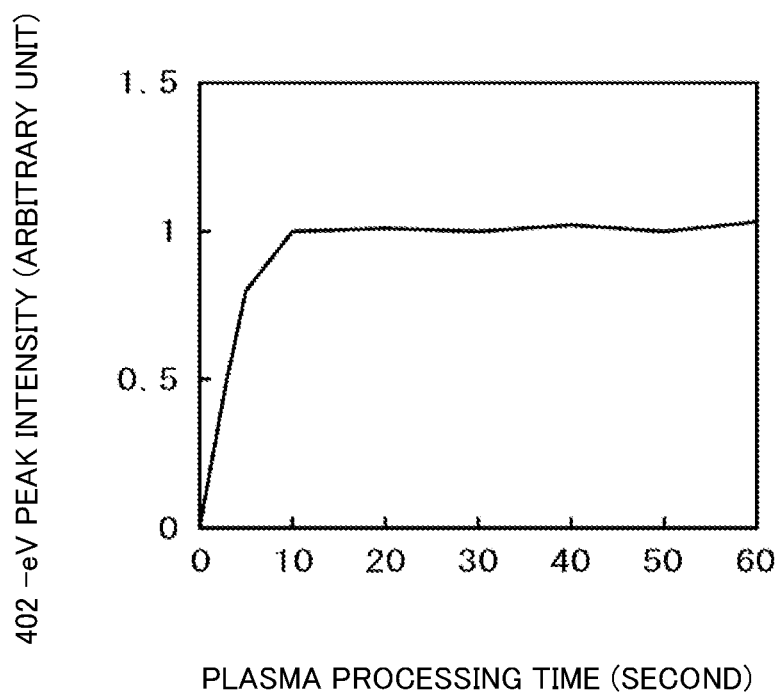
FIG. 5 is a view illustrating reaction time dependency of the amount of generation of the surface reaction layer that is formed when supplying the reactive species (radicals) which contain fluorine and hydrogen to the titanium nitride film in the etching method according to the first embodiment of the invention.

FIG. 5 is a graph illustrating dependency of peak intensity of 402±2 eV, which is caused by the surface reaction layer 324, on plasma processing time. The plasma processing time represents time elapsed after initiation of radio frequency power supply. As illustrated in FIG. 5, the peak intensity of 402±2 eV, which is caused by the surface reaction layer 324, increases with the elapse of the plasma processing time and exhibits a saturated tendency, and is approximately constant when the plasma processing time is 10 seconds or longer.

The property in which the generation amount of the reaction product has self-limiting property is similar to a natural oxidation phenomenon of a metal surface or a silicon surface. As described above, since self-limiting property exists in formation of the surface reaction layer, it is possible to make the generation amount (film thickness) of the surface reaction layer 324 generated per cycle constant by performing plasma processing equal to or longer than time necessary for the saturation. Furthermore, in this embodiment, 10 seconds are necessary until the generation amount of the surface reaction layer 324 is saturated, but time necessary for saturation varies in correspondence with apparatus parameters such as a distance between the plasma source and the wafer, and a substrate temperature.

After elapse of the plasma processing time necessary for saturation of generation of the surface reaction layer, supply of the raw material gas is stopped by using the valve 110, and supply of radio frequency power to the plasma source 106 is also stopped. In addition, a gas, which remains in the processing chamber 101, is exhausted by the variable conductance valve 107 and the vacuum pump 108.

Continuously, the infrared lamp 105 is turned on to vacuum-heat the surface of the wafer 318. At this time, irradiation time is set to 10 seconds, the highest arrival temperature on the wafer surface is set to 150° C., and a pressure is set to $1\times10^{-3}$ Pa.

This process is performed to sublimate the ammonium fluorotitanate, which is generated as the surface reaction layer, through decomposition into titanium tetrafluoride (in FIG. 2, a fluorine element is partially omitted) or ammonia, and hydrogen fluoride. The sublimation reaction is advantageous at a high temperature and a low pressure. The present inventors found that a temperature of 100° C. or higher and a pressure of 100 Pa or lower are necessary to cause the sublimation reaction.

Furthermore, in this embodiment, the highest temperature on the wafer surface is set to 150° C. and the pressure is set to $1\times10^{-3}$ Pa, but the maximum temperature may be set to an appropriate value in a temperature region of 100° C. or higher. A typical temperature range is 100° C. to 250° C., and a typical pressure in heating is $1\times10^{-5}$ to 100 Pa.

Figure 6:
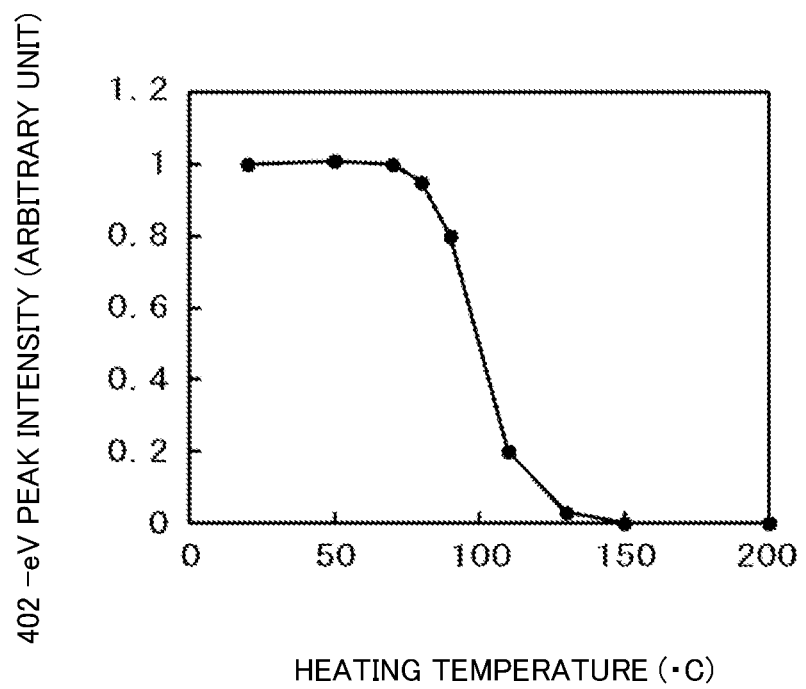
FIG. 6 is a view illustrating heating temperature dependency of a residual amount of the surface reaction layer when heating the surface reaction layer in the etching method according to the first embodiment of the invention.

FIG. 6 is a graph illustrating a variation of peak intensity of 402±2 eV, which is caused by the surface reaction layer 324, in a case of performing heating at the pressure of $1\times10^{-3}$ Pa for one minute at various temperatures. It can be seen that the peak intensity of 402±2 eV, which is caused by the surface reaction layer 324, rapidly decreases in the vicinity of a heating temperature of 100° C., and is lost in a case of performing heating at 150° C. The surface reaction layer may be sublimated at a relatively low temperature of 100° C. to 250° C., which is applicable to a semiconductor device manufacturing process, by performing vacuum-heating. In addition, when the temperature is set to 250° C. or lower, it is possible to shorten cooling time, and thus a throughput in an etching process is improved. This effect becomes significant as the number of cycles increases. Furthermore, it is preferable that a temperature when forming the surface reaction layer is set to a sufficiently low temperature (for example, lower than 50° C.) at which the surface reaction layer is not removed.

In addition, description will be given of the pressure during heating. At 100 Pa, sublimation occurs at 100° C. However, when the pressure is raised to 500 Pa, the sublimation temperature becomes approximately 350° C. A process temperature of a wiring layer is 400° C. or lower, and is typically approximately 350° C. A process pressure is preferably 500 Pa or lower from the viewpoint of the process temperature, and more preferably 100 Pa or lower in consideration of a situation in which a material such as carbon hard mask that is weak in thermal resistance is also used. It is preferable that the pressure in heating is as low as possible. The pressure is more preferably 10 Pa or lower, and still more preferably 0.1 Pa or lower. However, $1\times10^{-5}$ Pa or higher is preferable in consideration of a cost increase of exhaust facility or an increase in exhaust time.

Figure 7:
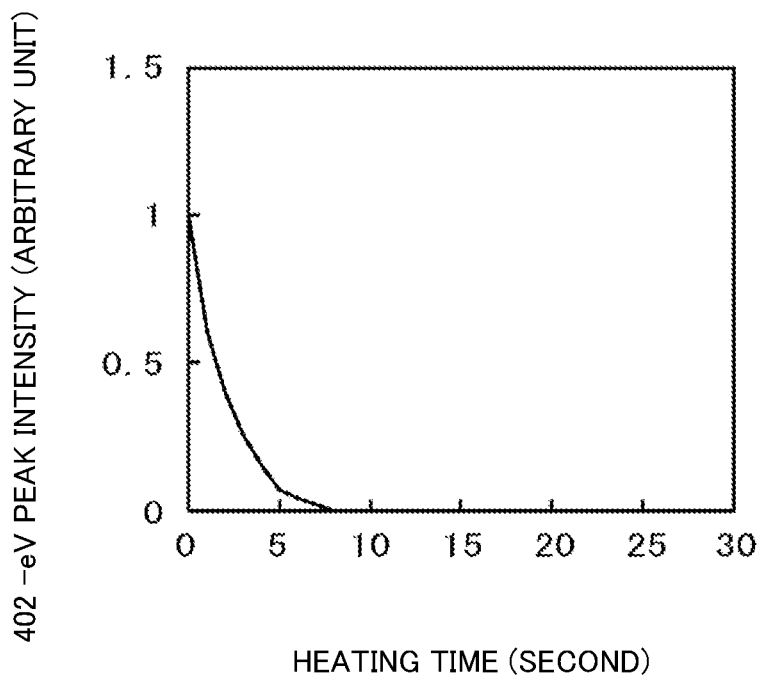
FIG. 7 is a view illustrating heating time dependency of the residual amount of the surface reaction layer when heating the surface reaction layer in the etching method according to the first embodiment of the invention.

FIG. 7 is a graph illustrating a variation of peak intensity of 402±2 eV, which is caused by the surface reaction layer 324, with respect to heating time when the surface reaction layer is removed by lamp heating at an temperature of 150° C. It can be seen that when a wafer surface is heated through irradiation with the infrared light 125, the peak intensity of 402±2 eV, which indicates a residual amount of the surface reaction layer, decreases, and completely disappears at heating time of 10 seconds. In the heating process, only the surface reaction layer 324, which is generated on the wafer surface, is decomposed and volatilizes, and no variation occurs in the unreacted titanium nitride film 327 that exists in a lower side of the surface reaction layer 324. Accordingly, it is possible to remove only the surface reaction layer 324. Accordingly, in addition to the first process of forming the surface reaction layer 324, the second process of removing the surface reaction layer 324 also has the self-limiting property.

Furthermore, in the heating process, the wafer 318 is in a state of being loaded on the wafer stage 102. However, supply of a helium gas used to increase thermal conductivity of a rear surface of the wafer is stopped, and a temperature of the wafer surface is set to be rapidly raised. On the other hand, in this embodiment, the wafer 318 is processed in a state of being loaded on the wafer stage 102, irradiation with infrared light can be performed in a state in which the wafer does not come into thermal contact with the wafer stage by using a lift pin and the like. After elapse of heating time necessary to remove the surface reaction layer 324, the infrared lamp 105 is turned off, and a residual gas in the processing chamber 101 is exhausted by using the vacuum pump 108.

Then, supply of the helium gas (not illustrated in the drawing) is restarted to increase thermal conductivity between the wafer 318 and the wafer stage 102, and a wafer temperature is cooled down to 10° C. by the circulator 116 and the cooling line 117, thereby terminating processing of first cycle.

As described above, a constant amount of the surface of the titanium nitride film is etched and removed by the first process of supplying the reactive species 223 which include radicals of fluorine and hydrogen to form the surface reaction layer 324, and the second process of decomposing and removing the surface reaction layer 324 through heating. In this embodiment, the etching amount of the surface of the titanium nitride film in one cycle is 0.5 nm. According to this, in this embodiment in which etching of 1.5 nm is necessary, the above-described cycle is repeated three times, and the etching is terminated.

According to the etching technology of this embodiment, the first process of forming the surface reaction layer 324 and the second process of removing the surface reaction layer 324 have the self-limiting property, and thus the etching amount of the surface of the titanium nitride film after one cycle becomes constant regardless of a position in an in-plane direction and a depth direction of the wafer. Accordingly, even in a case where a radical density varies in accordance with a position on the wafer or a position in the depth direction, the etching amount does not increase more than necessary or is not deficient, and the etching amount can be made to be uniform. In addition, a total etching amount is determined by the number of cycle repetition times, and becomes an integer multiple of the etching amount per cycle. As a result, in the etching technology of this embodiment, it is possible to greatly improve a yield ratio related to dimension controllability of the etching amount in comparison to etching with continuous plasma processing in the related art.

According to the above-described embodiment, it is possible to provide a technology of etching a titanium nitride film with high uniformity in a wafer in-plane direction or a pattern depth direction, and high processing-dimension controllability in an atomic layer level (isotropic and atomic layer level etching technology of the titanium nitride film). Furthermore, since a gas system that does not contain chlorine is used, it is possible to stably form the surface reaction layer on a surface of the titanium nitride film.

Second Embodiment

A second embodiment will be described with reference to FIG. 8, and FIG. 10 to FIG. 12. Furthermore, a configuration, which is described in the first embodiment but is not described in this embodiment, is applicable to this embodiment unless there are special circumstances. In this embodiment, description will be given of an example in which a titanium nitride film on a silicon wafer is selectively etched with respect to a silicon layer or a silicon dioxide film by using $CF_4/H_2/CO_2$ plasma.

Figure 10:
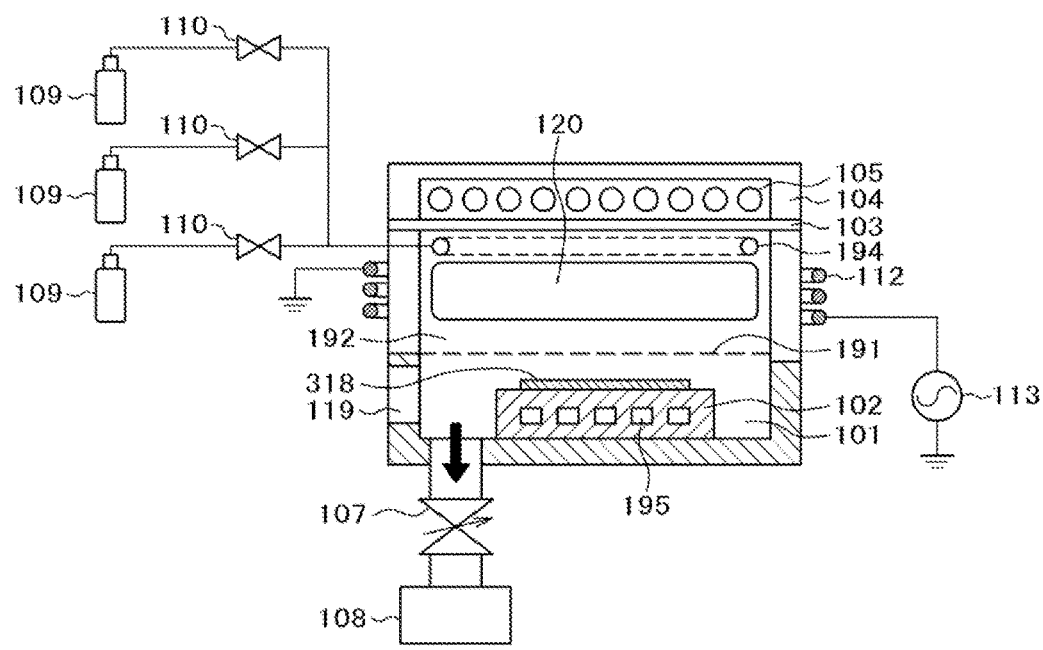
FIG. 10 is a schematic cross-sectional view of an etching apparatus according to the second embodiment of the invention.

FIG. 10 is a schematic cross-sectional view of a configuration of an etching apparatus according to this embodiment. The apparatus includes a wafer stage 102 that is provided inside an approximately cylindrical processing chamber 101, an approximately cylindrical plasma generation chamber 192 that is provided continuously from the processing chamber 101 with a quartz porous plate 191 interposed therebetween, a coil-shaped antenna 112 that is provided on an outer side of the plasma generation chamber 192, a lamp unit 104 that is provided on an upper side of the plasma generation chamber 192 with quartz glass 103 interposed therebetween, and an infrared lamp 105 that is provided inside the lamp unit 104. The processing chamber 101, the porous plate 191, the plasma generation chamber 192, the quartz glass 103, and the lamp unit 104 are configured to have an air-tight structure with a vacuum sealing unit such as an O-ring, and the air-tight structure is evacuated by a vacuum pump 108 that is connected thereto through a variable conductance valve 107.

In addition, in the apparatus, a gas supply unit including a gas cylinder 109, a valve 110, and the like is provided, and a gas, which is supplied from the gas cylinder 109, is introduced from a donut-shaped gas rectifier 194 into the plasma generation chamber 192 through the valve 110. The introduced gas is activated with plasma 120, which is generated by radio frequency power applied from a radio frequency power supply 113 to the coil-shaped antenna 112, to generate radicals, and the generated radicals are diffused in the plasma generation chamber 192, and are supplied to the processing chamber 101 after passing through openings of the porous plate 191 and reach a surface of a wafer 318. In addition, the wafer stage 102 is provided with a thermoelectric module 195, and the wafer temperature can be cooled down by radiating heat with a heat exchanger (not illustrated in the drawing).

As a material of the plasma generation chamber 192, a material, of which plasma resistance is high, a dielectric loss is small, and which is less likely to be the cause of particles or contamination, is preferable. For example, fused silica, a high-purity alumina sintered body, an yttrium oxide sintered body, and the like are preferable. In addition, as a material of the processing chamber 101, a metal, which is excellent in plasma resistance and is less likely to cause heavy metal contamination or contamination due to particles in the wafer, is preferable. For example, aluminum of which a surface is treated with anodized aluminum, and the like are preferable. In addition, a pressure of the processing chamber 101 can be constantly maintained by the variable conductance valve 107 and the vacuum pump 108 in a state in which a desired flow rate of processing gas is allowed to flow.

In addition, as a material of the wafer stage 102, aluminum of which a surface is treated with anodized aluminum, and the like are preferable. In addition, the wafer stage 102 is provided with a lift pin (not illustrated in the drawing) for wafer elevation.

The quartz glass 103, which is configured to maintain an air-tight state with the plasma generation chamber 192 by a vacuum sealing unit such as an O-ring, is provided on an upper side of the processing chamber 101. As the quartz glass 103, it is preferable to use a raw material with high optical transmittance. For example, it is preferable to use fused quartz glass with ultra-high purity which is obtained by fusing a high-purity raw material in oxyhydrogen flame, and the like.

In addition, the donut-shaped gas rectifier 194 as a rectification unit is provided in the plasma generation chamber 192 to supply a gas to an upper side of the plasma generation chamber 192. Furthermore, a shape of the rectification unit is appropriately selected in accordance with the purpose of changing a radical supply mode to the processing chamber 101. For example, when using a disc-shaped shower plate, it is possible to introduce radicals to the processing chamber with uniformity. At this time, as a material of the rectification unit, it is preferable to use a material that is excellent in plasma resistance and has a high optical transmittance, that is, ultra-high purity fused quartz glass and the like.

The lamp unit 104 including the infrared lamp 105 for wafer heating is provided on an upper side of the quartz glass 103. As the infrared lamp, a halogen lamp and the like can be used. A frequency of the radio frequency power supply 113 connected to the coil-shaped antenna 112 is appropriately selected in a range of 400 kHz to 40 MHz, and 27.12 MHz is used in this embodiment. In addition, the radio frequency power supply 113 has a frequency matching function (not illustrated in the drawing). That is, the radio frequency power supply 113 has a function that is capable of allowing an output frequency to vary from a center frequency of 27.12 MHz in a range of ±5% to ±10%, and is capable of performing a frequency feedback control so that a ratio between reflective wave power $P_r$ and progressive wave power $P_f$ which are monitored at an output portion of the radio frequency power supply 113, that is, $P_r/P_f$ decreases.

With regard to the kind of gases which are supplied to the plasma generation chamber 192, a combination of gases which contain hydrogen, oxygen, and fluorine, and do not contain nitrogen, is used to selectively etch the titanium nitride film with respect to a silicon layer or silicon dioxide film. Examples of a gas that contains hydrogen include HF, $H_2$, $CH_4$, $CHF_3$, $CH_2F_2$, $CH_3F$, and the like. Examples of a gas that contains oxygen include $O_2$, CO, $CO_2$, $SO_2$, and the like. Examples of a gas that contains fluorine include HF, $CF_4$, $CHF_3$, $CH_2F_2$, $CH_3F$, $C_2F_6$, $C_4F_8$, $SF_6$, and the like. In addition, in a case of using a gas in which a plurality of elements among hydrogen, oxygen, and fluorine are included in a molecule, it is possible to reduce the number of gases which are mixed. In addition, a mixed gas of the gases may be appropriately diluted by adding an inert gas such as Ar and He thereto. Furthermore, the description of "does not contain nitrogen" represents that the nitrogen is not supplied as a processing gas (and/or a diluting gas), and the amount of nitrogen that is contained in the processing gas (and/or the diluting gas) as an impurity may be regarded as the description of "does not contain".

In this embodiment, a gas that contains oxygen is used to secure selectivity with silicon and the like. The reason for this is as follows. When using the gas that contains oxygen, in a case where silicon and the like are exposed on a surface of a workpiece, the surface of the silicon and the like are oxidized and prevented from being etched, and thus high selectivity is obtained.

In addition, in this embodiment, a gas that does not contain nitrogen is used to secure selectivity with silicon dioxide and the like. The reason for this is as follows. When nitrogen is not included in a gas, a surface reaction layer formed from ammonium fluorosilicate is not generated on silicon dioxide, and thus etching of silicon dioxide is not progressed.

In addition, in this embodiment, a gas system that does not contain chlorine is used. The reason for this is as follows. When using a gas that contains chlorine, highly volatile titanium chloride is generated as a reaction product, and etching continuously progresses without remaining of the reaction product on the surface, and thus it is difficult to perform cycle etching with high controllability.

Specific combination examples include $CF_4/H_2/O_2$, $CHF_3/O_2$, $CH_2F_2/O_2$, $CH_2F_2/CO_2$, $CH_3F/O_2$, $C_2F_6/H_2/CO_2$, $C_2F_6/CH_4/CO$, $CF_4/H_2/CO_2$, and the like, and a combination that is suitable for a mixed gas is selected from the combinations in correspondence with selectivity that is required in each process. In this embodiment, plasma of $CF_4/H_2/CO_2$ is used from the viewpoint of obtaining high selectivity with respect to silicon and silicon dioxide, but other gas species may be used.

Furthermore, in this embodiment, description has been given of an example in which reactive species are supplied from plasma, but a vapor such as $H_2O$ and $CH_3OH$ may be separately supplied in addition to the reactive species which are supplied from plasma.

Etching of the titanium nitride film in this embodiment is progressed by repeating a first process of supplying radicals that contain hydrogen, oxygen, and fluorine to a silicon wafer, on which the titanium nitride film is formed, to be adsorbed on the titanium nitride film and to chemically react with the titanium nitride film, thereby forming a surface reaction layer, and a second process of decomposing and removing the surface reaction layer, which is formed through the chemical reaction, through heating.

Figure 8:
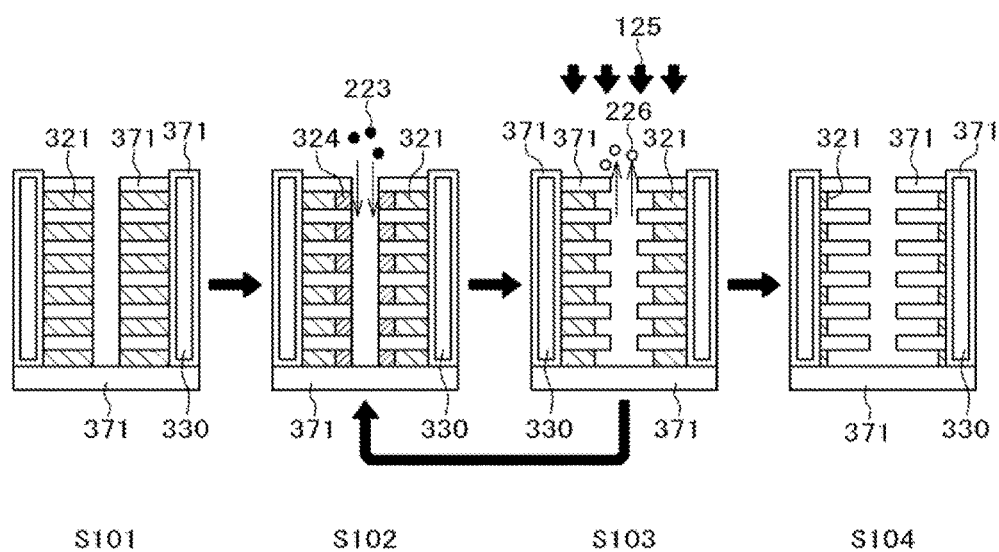
FIG. 8 is a schematic cross-sectional view illustrating an example of a procedure when processing a multi-layer structure including a titanium nitride film by using an etching method according to a second embodiment of the invention.
Figure 9:
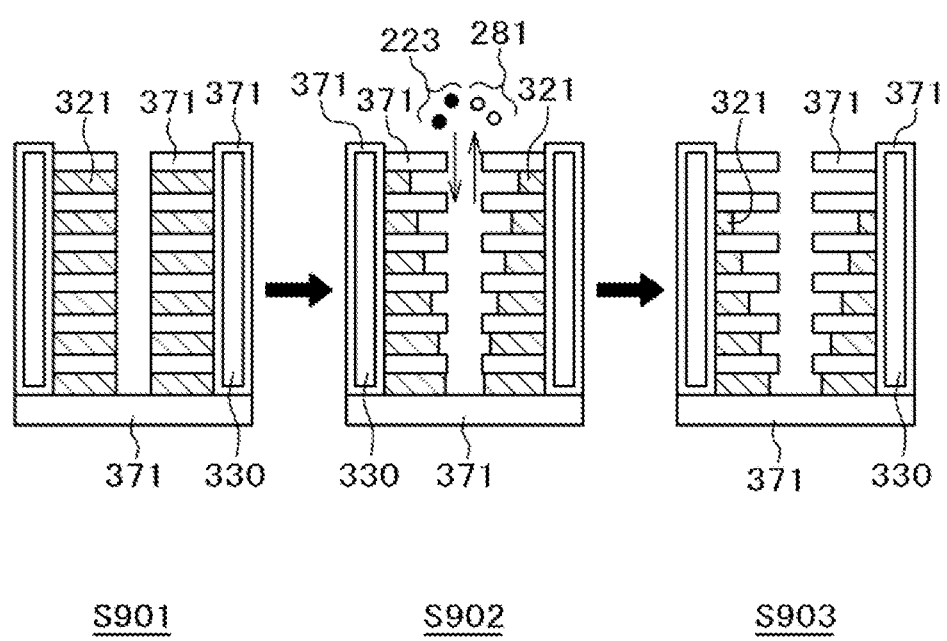
FIG. 9 is a schematic cross-sectional view illustrating an example of a procedure when processing a multi-layer structure including a titanium nitride film by using a plasma etching method in the related art which is examined by the present inventors.

FIG. 8 is a schematic view illustrating a variation of a wafer cross-sectional structure (multi-layer structure including the titanium nitride film) in a case of using the etching technology of this embodiment. A wafer cross-sectional structure before etching is the same as in FIG. 9, and thus description thereof will not be repeated. In this embodiment, in a groove having a high aspect ratio in which a titanium nitride film 321 and a silicon dioxide film 371 are alternately stacked, only the titanium nitride film 321 is selectively etched with respect to the silicon dioxide film 371 in a transverse direction (steps S101 to S104). As illustrated in step S102 and step S103 in FIG. 8, in a case of using the etching technology of this embodiment, the formation amount of the surface reaction layer 324 has a self-limiting property. Accordingly, an etching amount at the point of time, at which one cycle of a combination of the first process (step S102) and the second process (step S103) is terminated, becomes a constant value regardless of a position in a depth direction of a pattern (step S103). According to this, even after repeating the one cycle of the combination of the first process and the second process a plurality of times, an etching amount also becomes approximately constant regardless of the depth direction of the pattern, and a uniform etching amount distribution can be obtained (step S104). Furthermore, since a gas that does not contain nitrogen is used as a supply gas, a surface reaction layer formed from ammonium fluorosilicate is not generated on the surface of the silicon dioxide film, and thus it is possible to selectively etch only titanium nitride. In addition, since oxygen is included as a supply gas, a surface of a silicon layer (not illustrated in the drawing) is oxidized, and thus it is possible to selectively etch only the titanium nitride.

Specifically, first, a wafer 318, on which the titanium nitride film to be etched is formed, is carried in from a wafer carrying-in port 119 by a wafer transfer apparatus (not illustrated in the drawing), and is loaded on the wafer stage 102 (refer to FIG. 10 and step S101 in FIG. 8). At this time, a temperature of the wafer stage 102 is controlled to −20° C. by the thermoelectric module 195, and thus a wafer temperature is cooled down to −20° C. Then, in a state in which the wafer carrying-in port 119 is closed and the processing chamber 101 is air-tightly maintained, the processing chamber 101 is evacuated by the vacuum pump 108 through the variable conductance valve 107 (refer to FIG. 10).

On the other hand, a $CF_4$ gas, a $H_2$ gas, and a $CO_2$ gas are supplied from the gas cylinder 109 through the valve 110 and the like, and radio frequency power from the radio frequency power supply 113 is supplied to the coil-shaped antenna 112, and thus plasma 120 is formed. At this time, a flow rate of the $CF_4$ gas is set to 50 sccm, a flow rate of the $H_2$ gas is set to 50 sccm, and a flow rate of the $CO_2$ gas is set to 50 sccm. The raw material gases are activated by the plasma 120 into reactive species including radicals, and flow into the processing chamber 101 through a porous plate 191. The reactive species, which flow into the processing chamber 101 and include radicals, uniformly diffuse to the entirety of the processing chamber 101, and are adsorbed to the entire surface of the wafer 318 that is loaded on the wafer stage 102 (refer to FIG. 10).

The reactive species 223 which are adsorbed on the wafer 318, react with the titanium nitride film 321 on the surface of the wafer 318 to form a reaction product (surface reaction layer 324) in which Ti, N, H, and F are mixed with each other (refer to FIG. 10 and step S102 in FIG. 8). Here, hydrogen and fluorine, which are included in the reactive species 223, react with the titanium nitride, and the surface reaction layer 324, which contains ammonium fluorotitanate as a main component, is formed on the surface of the titanium nitride film 321 as the reaction product. Ions, which are generated in plasma, is hardly incident to the wafer 318 due to an effect obtained by a structure in which the porous plate 191 is provided between the wafer 318 and the plasma 120. Accordingly, non-selective etching caused by ion incidence hardly occurs, and thus it is possible to selectively etch the titanium nitride film. Particularly, etching of the silicon dioxide film, in which ion incidence is necessary for etching, hardly progresses.

After elapse of processing time that is set in order for the surface reaction layer 324 to be formed in a self-limiting manner, supply of the raw material gas by the valve 110 is stopped, and the radio frequency power supply 113 is also stopped. In addition, a gas, which is remains in the processing chamber 101, is exhausted by the variable conductance valve 107 and the vacuum pump 108.

Continuously, the infrared lamp 105 is turned on, and the surface of the wafer 318 is vacuum-heated by infrared light 125 (refer to FIG. 10, and step S103 in FIG. 8). At this time, the degree of vacuum is set to 0.1 Pa. Irradiation time of the infrared light 125 is set to 10 seconds, and the highest temperature on the wafer surface is set to 200° C. As a result, the surface reaction layer, which contains ammonium fluorotitanate as a main component, is decomposed and volatiles from the surface of the wafer 318, and is removed as a decomposition product 226.

After elapse of processing time that is set to remove the reaction product on the surface, the infrared lamp 105 is turned off, and a residual gas in the processing chamber 101 is exhausted by using the vacuum pump 108.

A surface portion of the titanium nitride film is etched and removed by a combination of the first process of forming the surface reaction layer through adsorption of the reactive species which include radicals (step S102 in FIG. 8), and the second process of removing the surface reaction layer through heating of wafer (step S103 in FIG. 8). It is possible to perform etching in a necessary amount with controllability by repeatedly performing the first process and the second process in a cyclic manner (refer to step S104 in FIG. 8).

Figure 11:
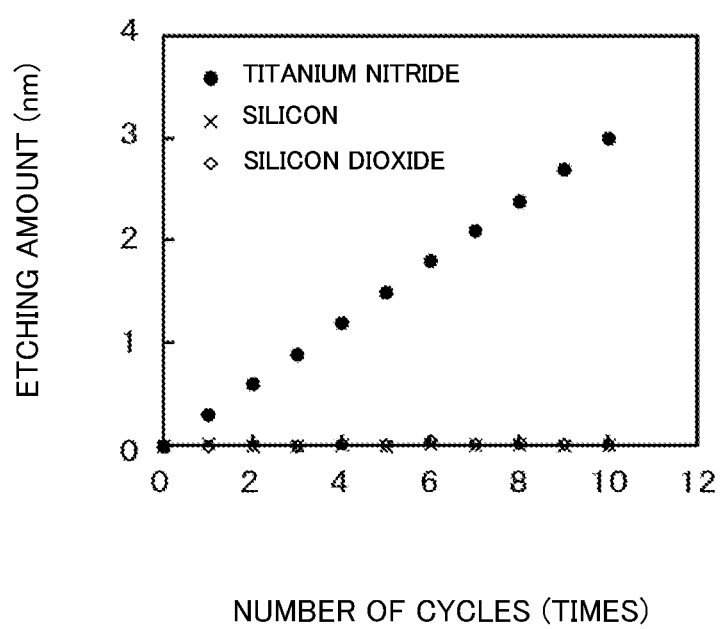
FIG. 11 is a view illustrating cycle number dependency of an etching amount when using the etching method according to the second embodiment of the invention.

FIG. 11 illustrates cycle number dependency of an etching amount in various films such as the titanium nitride film in a case of performing etching by using the cycle processing of this embodiment. An ellipsometer is used in measurement of the etching amount. The etching amount of the titanium nitride film gradually increases in proportion to the number of cycles, and the etching amount for each cycle is 0.3 nm. In this embodiment, etching in a total amount of 3 nm is necessary, and thus the cycle is repeated ten times to obtain a target etching amount with high accuracy.

Furthermore, the etching amount per cycle can be controlled by changing a substrate temperature in a reaction process or gas species which are used, and thus the etching amount can be appropriately adjusted in correspondence with processing dimensions which are required. In addition, in this embodiment, $CF_4/H_2/CO_2$ are used as gas which contain fluorine, hydrogen, and oxygen and do not contain nitrogen, and it can be seen that the silicon layer and the silicon dioxide film are not etching by the gases which are used. According to this, it is possible to etch the titanium nitride film with high selectivity with respect to the silicon layer or the silicon dioxide film.

Figure 12:
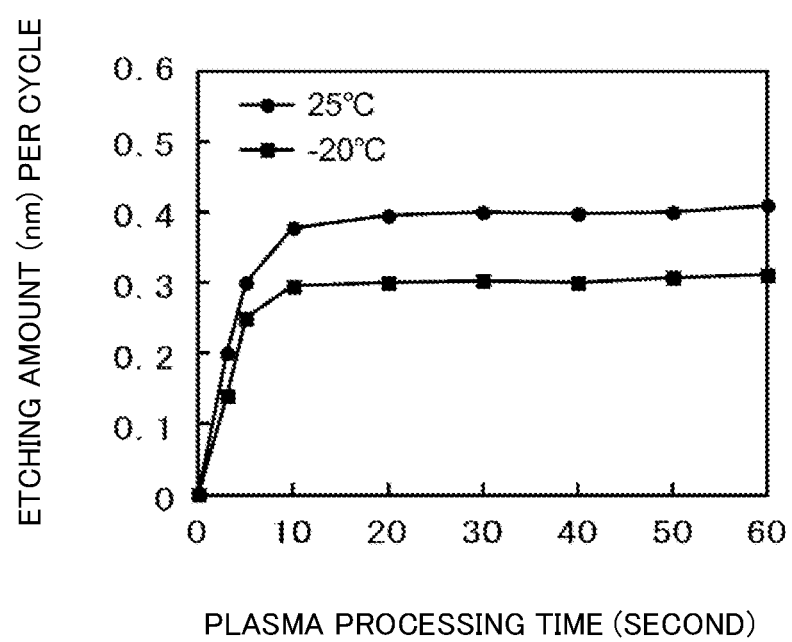
FIG. 12 is a view illustrating plasma processing time dependency of a one-cycle etching amount when using the etching method according to the second embodiment of the invention.

FIG. 12 illustrates plasma processing time dependency of the etching amount of the titanium nitride film per cycle in combination of the first process and the second process. Here, the substrate temperature in plasma processing is changed as a parameter, and is set to −20° C. or 25° C. It can be seen that a saturation value of the etching amount is 0.3 nm in a case where the substrate temperature is −20° C., and the saturation value of the etching amount is 0.4 nm in a case where the substrate temperature is 25° C. According to this, for example, in a case where it is necessary to etch the titanium nitride film only in a total amount of 0.8 nm, after the substrate temperature in the process of forming the surface reaction layer is set to 25° C. to adjust the etching amount per cycle to 0.4 nm, the cycle processing may be repeated two times.

Furthermore, changing of a gas mixing ratio may be effective in comparison to changing of the substrate temperature when adjusting the etching amount per cycle in accordance with the gas species which are used. In this case, the etching amount per cycle may be adjusted by adjusting the gas mixing ratio.

Furthermore, in the technology of this embodiment in which nitrogen is not included as a supply gas, etching hardly progresses in a film material that does not contain nitrogen. For example, since silicon or silicon dioxide does not contain nitrogen, even when performing the cycle processing of this embodiment, a surface reaction layer, which is formed from an ammonium salt such as ammonium fluorosilicate, is not generated on a surface, and etching hardly progresses. According to this, it is possible to etch titanium nitride while maintaining high selectivity with respect to silicon or silicon dioxide.

In addition, in the process of this embodiment, since oxygen is included in the reactive species, a silicon surface is oxidized, and it is possible to further suppress progress of an etching reaction on the silicon surface. Due to the effects, when using the gas chemistry and the cycle procedure of this embodiment, even in a case where the silicon layer, the silicon dioxide film, and the like are exposed on a surface of a workpiece, it is possible to selectively etch only the titanium nitride film.

As illustrated in FIG. 11, the etching amount of the silicon layer and the silicon dioxide film in a case of using the cycle etching technology of this embodiment is equal to or less than a measurement limit, and it is possible to etch only the titanium nitride film with selectivity of 100 to 1 or greater with respect to the silicon layer or the silicon dioxide film.

According to this embodiment, it is possible to obtain the same effect as in the first embodiment. In addition, since oxygen is contained in the supply gas when forming the surface reaction layer on the titanium nitride film, it is possible to selectively etch the titanium nitride film with respect to the silicon layer. In addition, since nitrogen is not included in the supply gas when forming the surface reaction layer on the titanium nitride film, it is possible to selectively etch the titanium nitride film with respect to the silicon dioxide film.

Furthermore, the invention is not limited by the embodiments, and various modification examples are included in the invention. The configuration illustrated in the embodiment may be substituted with a substantially the same configuration, a configuration capable of obtaining the same operational effect, or a configuration capable of accomplishing the same object. For example, in the above-described configuration, the infrared lamp 105 is provided on an outer side of the plasma generation chamber 192, but may be formed on an inner side of the plasma generation chamber 192. In addition, the above-described embodiments are described in detail for easy understanding of the invention, but it is not limited to include the entirety of configurations described above.

What is claimed is:

1. An etching method for etching a titanium nitride film, comprising:
    a first process of supplying reactive species, which include hydrogen and fluorine, to a base material that includes a titanium nitride film on at least a part of a surface; and
    a second process of vacuum-heating the base material to remove a surface reaction layer that is formed on a surface of the titanium nitride film in the first process.

2. The etching method according to claim 1,
    wherein a combination of the first process and the second process is set as one cycle, and a plurality of the cycles are repeated.

3. The etching method according to claim 1,
    wherein the reactive species are generated by plasma of a processing gas that includes a material including hydrogen as a constituent element, and a material including fluorine as a constituent element.

4. An etching method, comprising:
    repeating a cycle of a combination of a first process and a second process a plurality of times, the first process being configured to supply reactive species, which include hydrogen, oxygen, and fluorine, to a base material that includes a titanium nitride film on at least a part of a surface, and the second process being configured to vacuum-heat the base material to remove a surface reaction layer that is formed on a surface of the titanium nitride film in the first process.

5. The etching method according to claim 4,
    wherein the reactive species are generated by plasma of a processing gas that includes a material including hydrogen as a constituent element, a material including oxygen as a constituent element, and a material including fluorine as a constituent element.

6. The etching method according to claim 1, wherein the reactive species are generated by plasma of a processing gas that does not include a material including chlorine as a constituent element.

7. The etching method according to claim 1, wherein the reactive species are generated by plasma of processing gas that does not include a material including nitrogen as a constituent element.

8. The etching method according to claim 1, wherein the surface reaction layer mainly contains nitrogen that is bonded to hydrogen, and titanium that is bonded to fluorine.

9. The etching method according to claim 1, wherein the surface reaction layer contains ammonium fluorotitanate as a main component.

10. The etching method according to claim 1, wherein a temperature of the base material in vacuum heating is 100° C. or higher.

11. The etching method according to claim 1, wherein a degree of vacuum of the base material in vacuum heating is 100 Pa or lower.

12. The etching method according to claim 1, wherein a generation amount of the surface reaction layer has a saturation property with respect to processing time of the first process.

* * * * *